(12) United States Patent
Shimizu et al.

(10) Patent No.: US 6,369,615 B1
(45) Date of Patent: Apr. 9, 2002

(54) SEMICONDUCTOR INTEGRATED CIRCUIT AND PULSE SIGNAL GENERATING METHOD

(75) Inventors: Hiroshi Shimizu, Yokohama; Hideo Akiyoshi, Kawasaki, both of (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/644,549

(22) Filed: Aug. 24, 2000

(30) Foreign Application Priority Data

Sep. 30, 1999 (JP) ............................................ 11-280620

(51) Int. Cl.[7] ............................................ H03K 19/096
(52) U.S. Cl. ............................. 326/93; 326/95; 326/98; 326/121; 327/171; 327/172
(58) Field of Search .............................. 326/93, 95, 98, 326/112, 119, 121, 122; 327/171, 172, 173, 174, 178, 182

(56) References Cited

U.S. PATENT DOCUMENTS

| | | | | |
|---|---|---|---|---|
| 5,590,081 A | * | 12/1996 | Shimizu | ..................... 365/203 |
| 5,723,993 A | * | 3/1998 | Cha | ........................... 327/172 |
| 5,896,341 A | * | 4/1999 | Takahashi | .............. 365/230.06 |
| 6,020,763 A | * | 2/2000 | Gabillard | ..................... 326/108 |
| 6,111,444 A | * | 8/2000 | Mikan, Jr. et al. | .......... 327/211 |
| 6,124,737 A | * | 9/2000 | Lan et al. | .................... 326/121 |
| 6,127,850 A | * | 10/2000 | Lan et al. | ..................... 236/98 |

* cited by examiner

*Primary Examiner*—Michael Tokar
*Assistant Examiner*—Vibol Tan
(74) *Attorney, Agent, or Firm*—Arent Fox Kintner Plotkin & Kahn, PLLC

(57) ABSTRACT

The present invention is intended to realize reduction of time for supplying the pulse signal to the internal circuit. The setup time for latching (holding) the signal can be eliminated by generating a pulse signal without latching (holding) the input signal. A semiconductor integrated circuit is provided, which has a signal input circuit for receiving an input signal and outputting an address signal as a function of the input signal without holding the output signal. A pulse signal generating circuit is coupled to the signal input circuit for generating a pulse signal based on the output signal and a first clock signal.

15 Claims, 16 Drawing Sheets

SEMICONDUCTOR INTEGRATED CIRCUIT AND PULSE SIGNAL GENERATING METHOD

BACKGROUND OF THE INVENTION

The present invention relates to a semiconductor integrated circuit in which an internal circuit operates with a pulse signal.

For example, in a memory macro, the internal circuit operates with a pulse signal. Therefore, it is required to generate a pulse signal that is supplied to the internal circuit on the basis of the clock that is externally supplied.

FIG. 1 illustrates a prior art circuit for generating a pulse signal to be used within the memory macro.

The circuit illustrated in FIG. 1 is formed of a signal input circuit 1, a signal latch circuit 2 and a pulse signal generating circuit 3.

In the signal input circuit 1, an address signal A is supplied from an address signal input terminal 4. The address signal A is supplied to a signal latch circuit 2 as an inverted address signal/A (hereinafter/A is identical to A-bar, indicating the inverted value of A) via an inverter 9. Moreover, the address signal A is supplied to the signal latch circuit 2 via the inverter 9 and inverter 10.

In the signal latch circuit 2, the address signal A or a clock signal LCK is supplied to the clock signal terminal 5 for latching. The inverted address signal/A is supplied to a transmission transistor 12 and the address signal A is supplied to a transmission transistor 13.

The clock signal LCK for latching and the inverted clock signal/LCK for latching, which is inverted by the inverter 11, are supplied to the transmission transistor 12 and transmission transistor 13, respectively. Any one of the transmission transistor 12 or transmission transistor 13 becomes conductive in the predetermined timing on the basis of the clock signal LCK for latching and any one of the address signal A or inverted address signal/A is latched (stored and held) in the latch circuit (memory circuit) formed of the inverter 14 and inverter 15.

The pulse signal generating circuit 3 is formed of a NAND circuit 16 and a NAND circuit 17. The inverted address signal/A is stored and held by the NAND circuit 16 when the transmission transistor 12 becomes conductive and the clock signal ICK for the internal circuit are supplied. The address signal A is stored and held by the NAND circuit 17 when the transmission transistor 13 becomes conductive and the clock signal ICK for the internal circuit are supplied.

The pulse signal generating circuit 3 generates a pulse signal and is outputted from the output terminal 7 and output terminal 8, and is then supplied to the internal circuit.

FIG. 2 is a timing chart showing the address signal A change to a low level (LOW LEVEL) in the circuit of FIG. 1 when the address signal A is supplied to the address signal input terminal 4.

(1) The address signal A changes to the low level.

(2) The clock signal LCK for latching changes to the low level.

When such signal level change, the transmission transistor 12 becomes conductive and the high-level inverted address signal/A is latched by the latch circuit.

(3) The clock signal LCK for internal circuit changes to the high level.

When such signal level change, the high level inverted address signal/A is supplied to one of the input terminals of the NAND circuit 16 and the high level clock ICK for the internal circuit is supplied to the other input terminal. While the clock signal ICK for the internal circuit is in the high level, the low-level pulse signal AO is outputted from the output terminal 7.

In order to latch the address signal, the setup time ST1 and hold time HT1 to the clock signal LCK for latching is required.

Moreover, since it is required to generate a pulse signal after the address signal is reliably latched with the latch circuit, it is also required to provide the setup time ST2 to the clock signal CLK for the internal circuit.

As explained above, two setup times ST1 and ST2 are required until the pulse signal supplied to the internal circuit is generated from the input of the address signal. The prior art for generating the pulse signal has a problem wherein a certain period of time is required for generating a pulse signal from the input of the address signal. Therefore, high speed operation cannot be realized.

SUMMARY OF THE INVENTION

In order to solve the problems explained above, the present invention provides a semiconductor integrated circuit comprising a signal input circuit for receiving an input signal and providing an output signal without holding the input signal or an inverted signal thereof; and a pulse signal generating circuit for generating a pulse signal to be supplied to an internal circuit based on a signal outputted from the signal input circuit and a first clock signal.

Moreover, the present invention provides a semiconductor integrated circuit in which a circuit for holding an input signal or an inverted input signal is not provided on the signal path that is sequentially connected to the signal input circuit for receiving an input signal; and it provides an output without holding the input signal or an inverted signal thereof. A pulse signal generating circuit generates a pulse signal to be supplied to an internal circuit based on the signal outputted from signal input circuit and a first clock signal.

The present invention also provides a semiconductor integrated circuit which comprises a signal input circuit for receiving an input signal and providing an output signal without holding the input signal or an inverted signal thereof. A pulse signal generating circuit generates a pulse signal to be supplied to an internal circuit based on the signal outputted from the signal input circuit, a first clock signal and a third clock signal.

The semiconductor integrated circuit of the present invention generates a pulse signal without latching (storing or holding) the input signal. Therefore, a setup time for latching (storing or holding) the input signal is not required. The time required for generating the pulse signal from the input of address signal may be shortened and highspeed circuit operation may be realized. Moreover, a pulse signal can be generated with a simplified circuit structure and the circuit structure can be reduced in size.

According to the present invention, the pulse signal may be generated without latching (storing or holding) the input signal. Therefore, the setup time for latching the input signal is no longer required and the time required for generating a pulse signal from the input of the address signal can be shortened and high-speed circuit operation can also be attained. Moreover, the pulse signal can be generated with a simplified circuit structure and the circuit configuration can be reduced in size.

BRIEF DESCRIPTION OF THE DRAWINGS

FIG. 3 (2) is a diagram illustrating a block diagram of SRAM.

FIG. 8 (2) is a diagram illustrating the second embodiment of the present invention.

FIG. 12 (2) is a diagram illustrating the fourth embodiment of the present invention.

FIG. 16 (2) is a diagram illustrating the fifth embodiment of the present invention.

FIG. 16 (3) is a diagram illustrating the fifth embodiment of the present invention.

FIG. 16 (4) is a diagram illustrating the fifth embodiment of the present invention.

FIG. 16 (5) is a diagram illustrating the fifth embodiment of the present invention.

FIG. 16 (6) is a diagram illustrating the fifth embodiment of the present invention.

FIG. 16 (7) is a diagram illustrating the fifth embodiment of the present invention.

FIG. 16 (8) is a diagram illustrating the fifth embodiment of the present invention.

DETAILED DESCRIPTION

Figure 3:
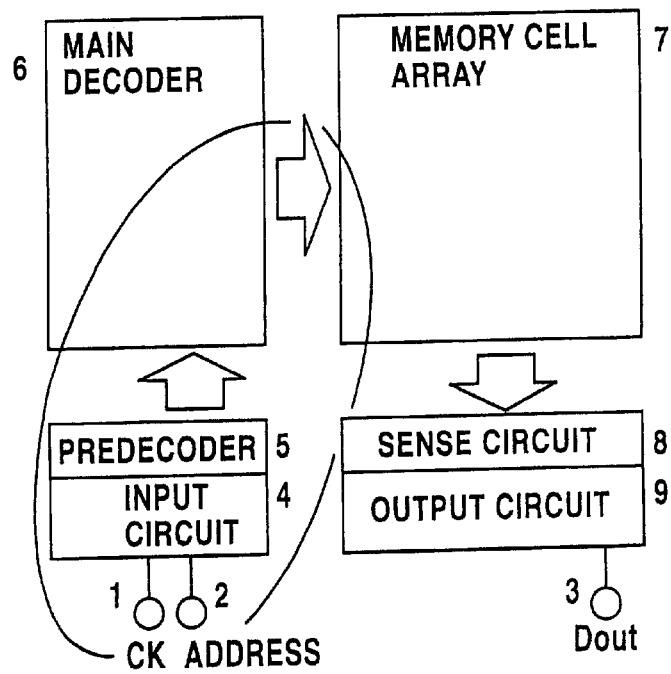
FIG. 3 (1) is a diagram illustrating a block diagram of SRAM.
Figure 3:
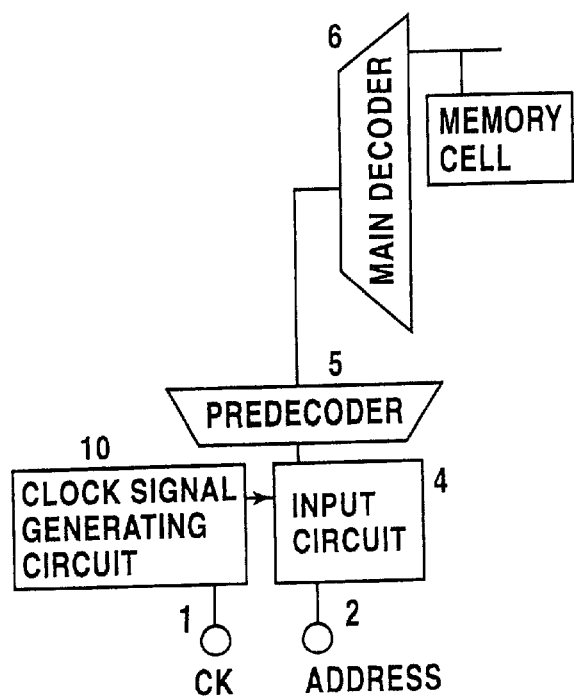

FIGS. 3(1) and 3(2) illustrate the block diagrams of SRAM (Static Random Access Memory).

The clock signal is supplied to the input circuit 4 from the clock signal terminal 1, while the address signal is also supplied to the input circuit 4 from the address signal input terminal 2. The input circuit 4 fetches the address signal based on the clock signal and supplies the address signal to a predecoder 5. The predecoder 5 predecodes the address signal and supplies it to a main decoder 6. The main decoder 6 decodes the address signal and supplies it to a memory cell array 7 to select the memory cell corresponding to the address signal. A sense circuit 8 amplifies the information in the selected memory cell and supplies the amplified information to an output circuit 9. The output circuit 9 outputs the amplified information to an output terminal 3. Although not illustrated, the external information is also written to the memory cell on the basis of the address signal in the SRAM illustrated in FIGS. 3(1) and 3(2).

The clock signal supplied to the input circuit 4 is supplied from the clock signal generating circuit 10 as illustrated in FIG. 3(2).

The circuit generating the pulse signal of the present invention is provided within or at the area near the input circuit 4, and the clock signal is supplied thereto from the clock signal generating circuit 10.

FIRST EMBODIMENT

Figure 4:
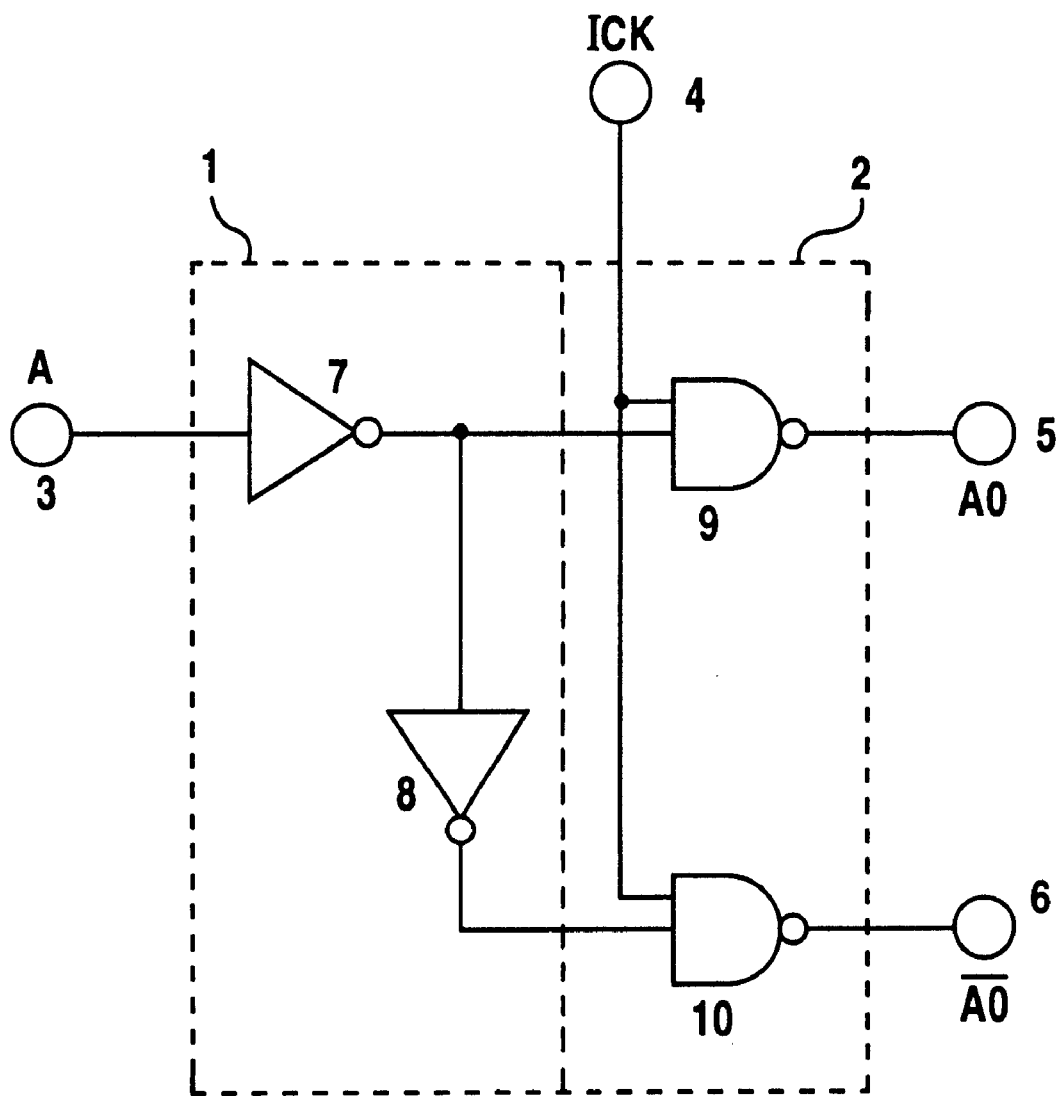
FIG. 4 is a diagram illustrating the first embodiment of the present invention.

FIG. 4 illustrates the first embodiment of the present invention.

The circuit illustrated in FIG. 4 is formed of a signal input circuit 1 and a pulse signal generating circuit 2.

In the signal input circuit 1, the address signal A is supplied from the address signal input terminal 3. The address signal A is then supplied as the inverted address signal /A to the pulse signal generating circuit 2 via the inverter 7. Moreover, the address signal A is supplied to the pulse signal generating circuit 2 via the inverter 7 and inverter 8.

In the pulse signal generating circuit 2, the inverted address signal /A is supplied to one of the input terminals of NAND circuit 9, while the address signal A is supplied to one of the input terminal of NAND circuit 10. The clock signal ICK for an internal circuit is supplied from the clock signal terminal 4 for an internal circuit respectively to the other input terminals of NAND circuits 9 and 10.

The pulse signal generating circuit 2 then generates a pulse signal and is outputted from the output terminal 5 or 6 and is then supplied to an internal circuit.

Figure 1:
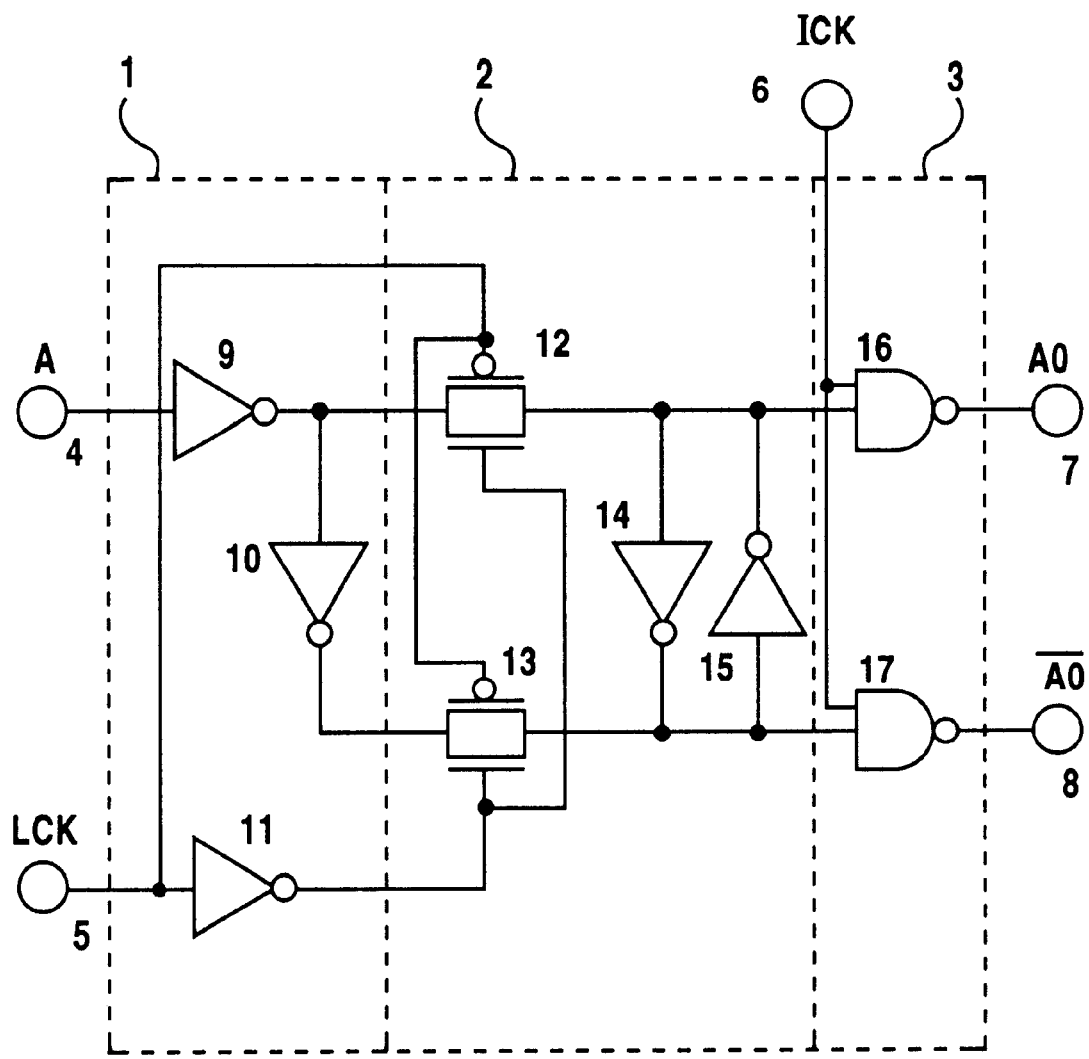
FIG. 1 is a diagram illustrating a semiconductor integrated circuit of the related art.
Figure 2:
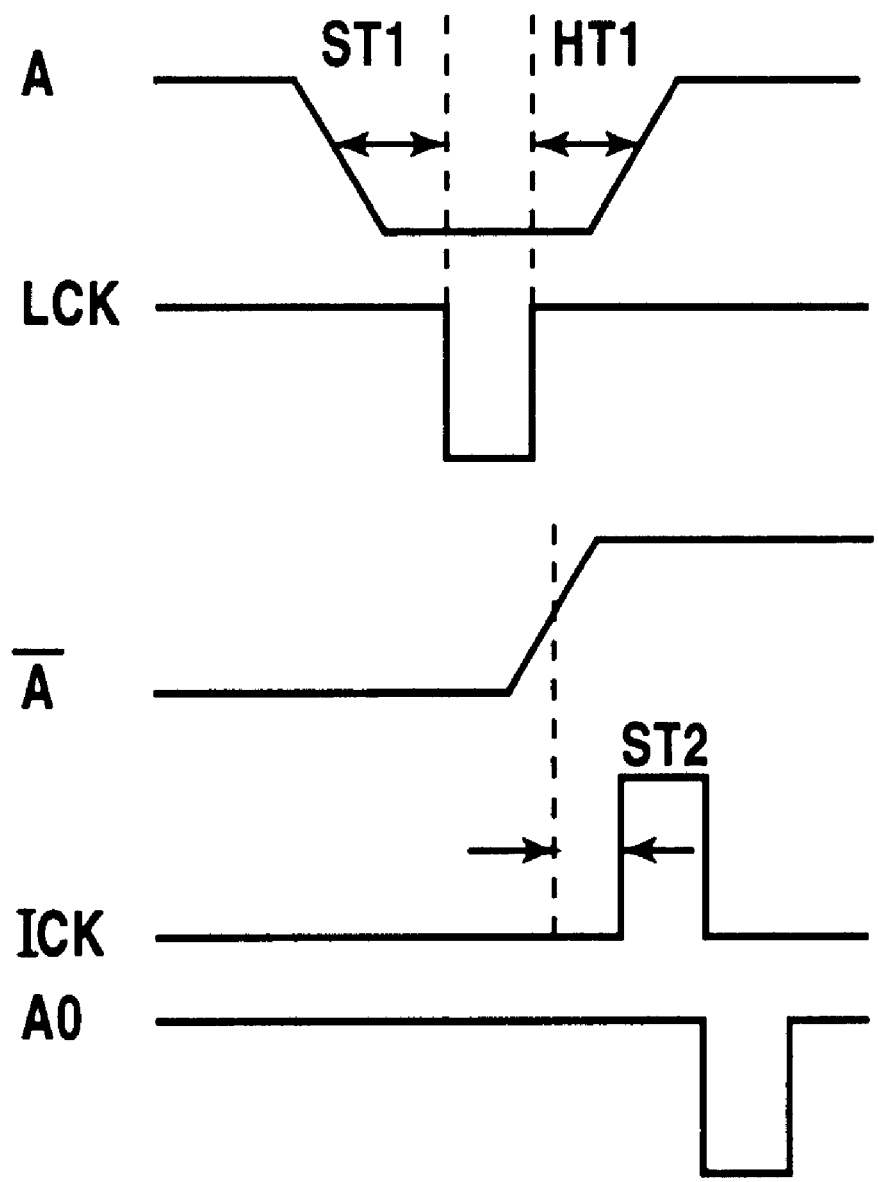
FIG. 2 is a timing chart illustrating operations of the semiconductor integrated circuit of the related art.

The difference from the prior art circuit illustrated in FIG. 1 is that a signal latch circuit is not used. Namely, a signal latch circuit formed of a clock signal terminal for latching a pair of transmission transistors and a memory circuit, including a pair of inverters, are not used in the first embodiment.

Figure 5:
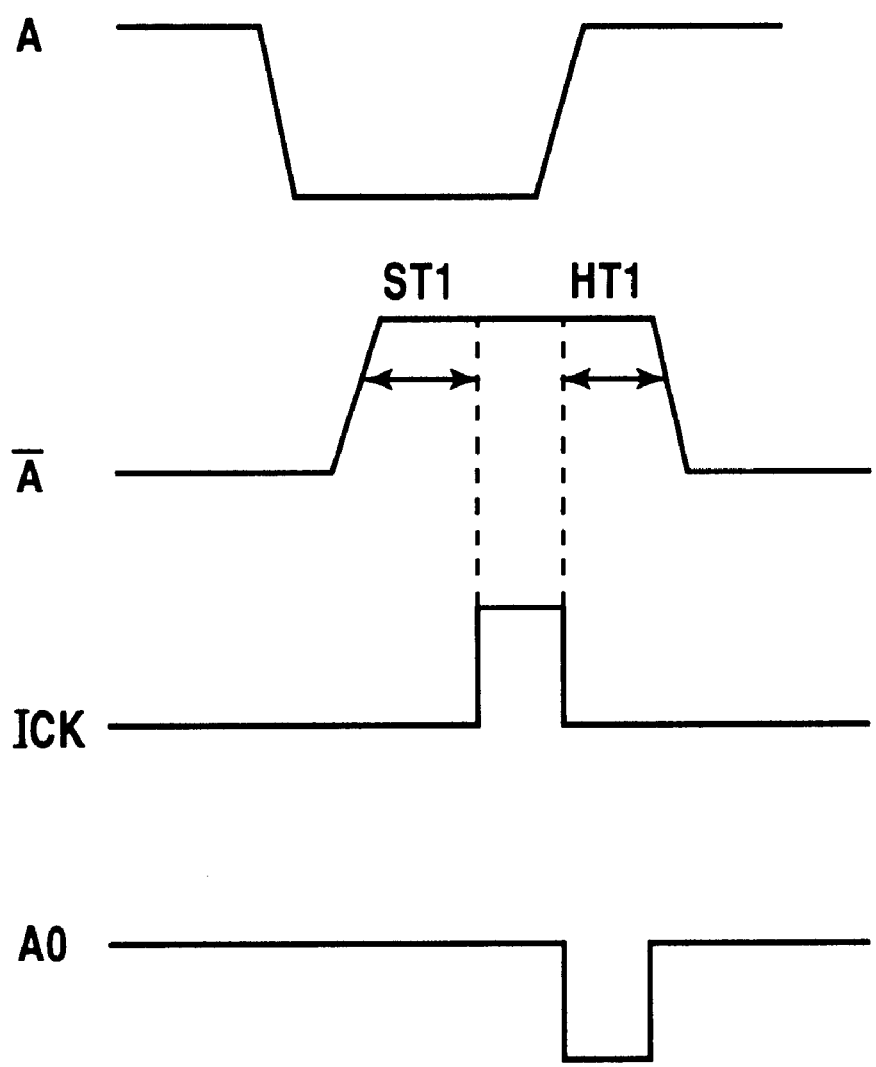
FIG. 5 is a diagram illustrating the first embodiment of the present invention.

FIG. 5 is a timing chart showing that the address signal A supplied to the address signal input terminal 3 changes to the low level in the circuit of FIG. 4.

(1) The address signal A changes to the low level. With this change, the high-level inverted address signal /A is supplied to one of the input terminals of the NAND circuit 9 after the delay time of the inverter 7.

(2) The clock signal ICK for an internal circuit changes to the high level.

With this change, the high-level clock signal ICK for an internal circuit is supplied to the other input terminal of the NAND circuit 9. While the clock signal ICK for an internal circuit is in the high level, the low-level pulse signal AO is outputted from the output terminal 5.

In the first embodiment of the present invention, it is sufficient to fetch the address signal only to generate the pulse signal since the address signal is not latched (stored and held). Namely, it is enough to set the setup time ST1 and hold time HT1 to the clock signal ICK for an internal circuit. Therefore, as illustrated in FIG. 5, only one setup time (ST1) is required when the pulse signal supplied to an internal circuit is generated from the input of the address signal. The time required for generating the pulse signal supplied to an internal circuit from the input of the address signal can be shortened in comparison with the prior art circuit illustrated in FIG. 1 which requires a couple of setup times.

Figure 6:
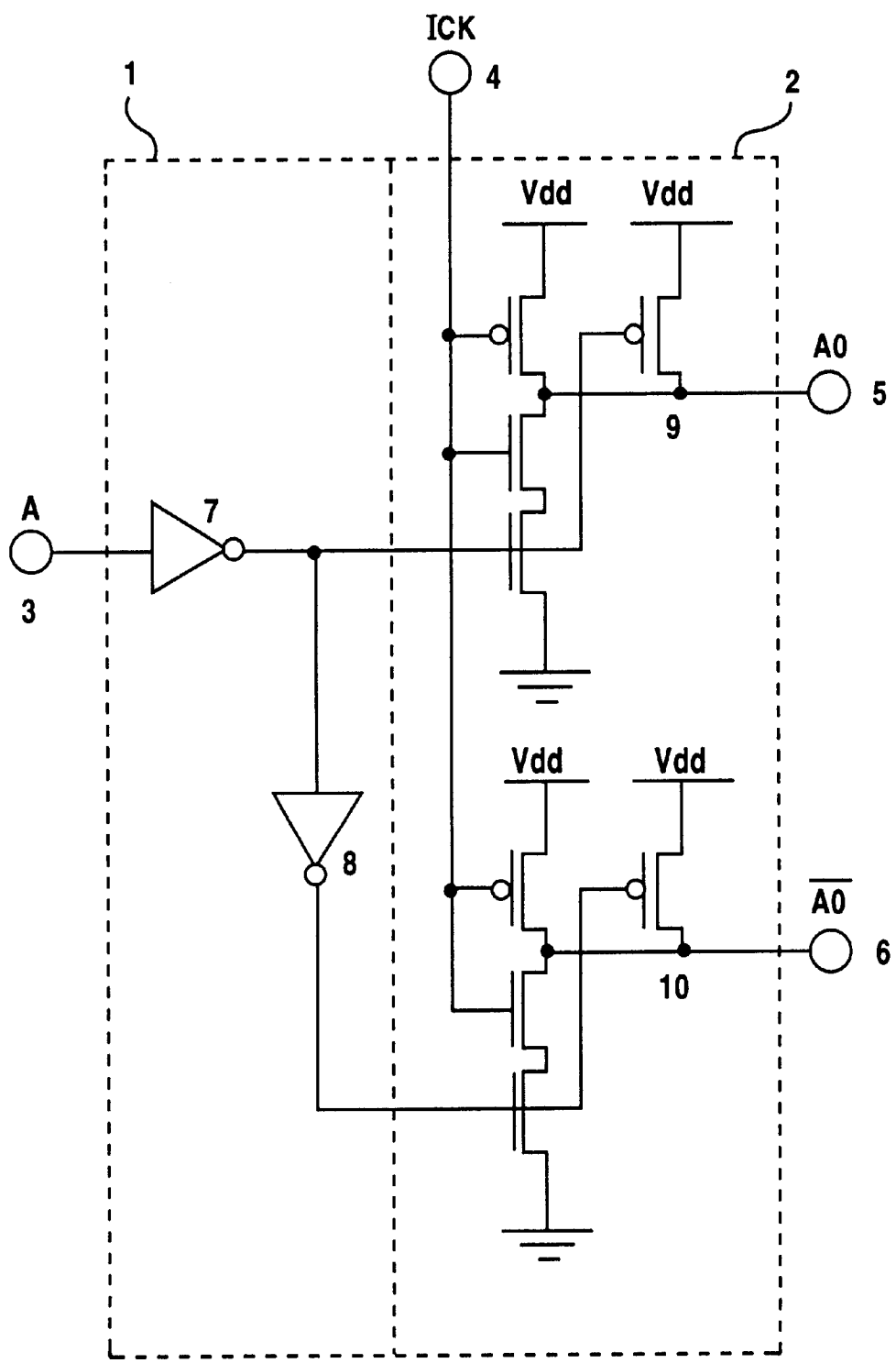
FIG. 6 is a diagram illustrating the first embodiment of the present invention.

FIG. 6 is identical to the circuit of FIG. 4 and the NAND circuits 9 and 10 may be formed of the transistors.

Figure 7:
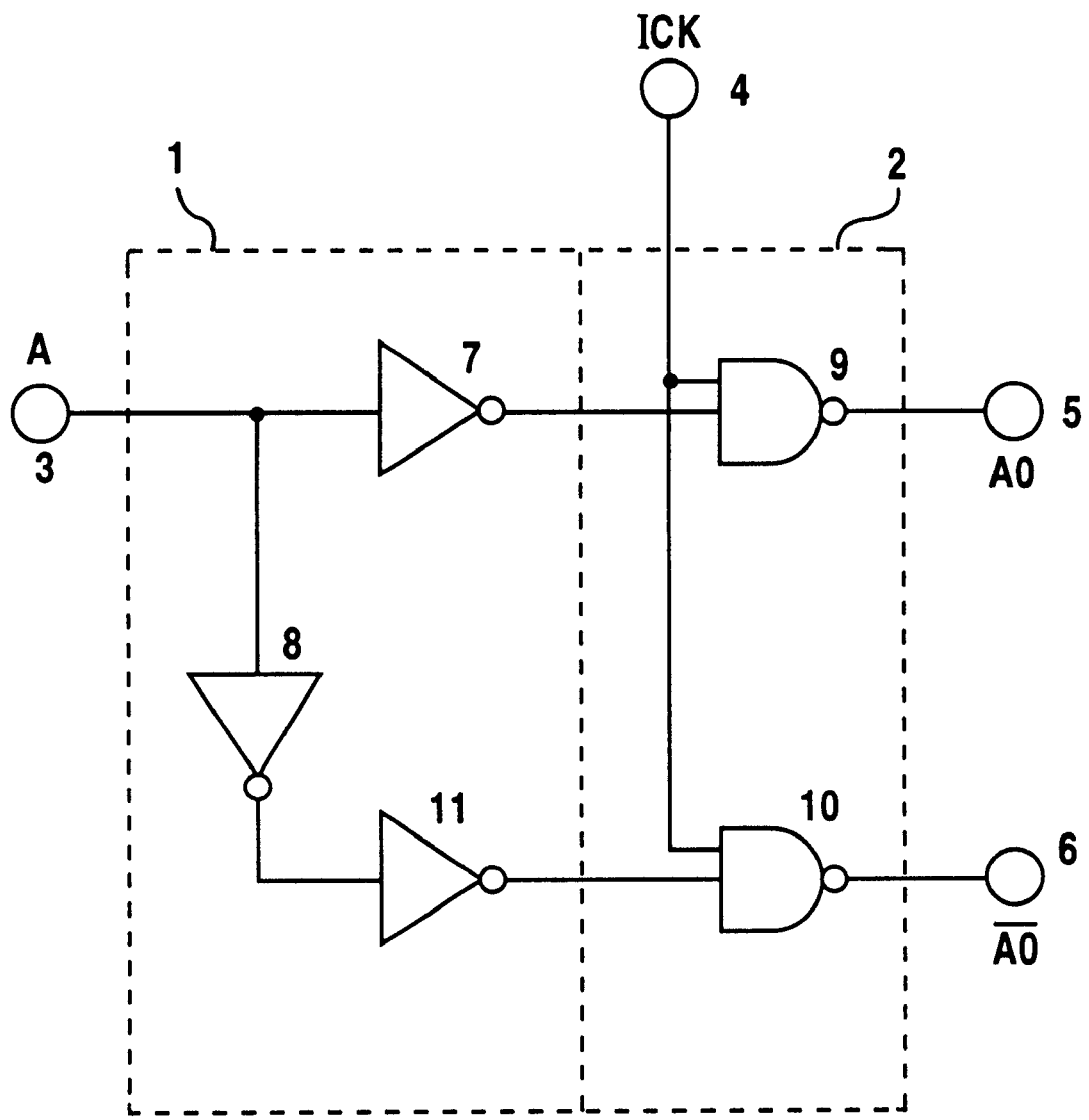
FIG. 7 is a diagram illustrating the first embodiment of the present invention.

In FIG. 7, the structure of the signal input circuit is different from the circuit of FIG. 4.

In the signal input circuit 1, the address signal A is supplied from the address signal input terminal 3. The address signal A is supplied to the pulse signal generating circuit 2 as the inverted address signal/A via the inverter 7. Moreover, the address signal A is supplied to the pulse signal generating circuit 2 via the inverters 8 and 11.

The signal input circuit 1 has the function of supplying the address signal A and inverted address signal/A to the pulse signal generating circuit 2. Therefore, any type of circuit configuration, which satisfies such function, may be used as well as the signal input circuit illustrated in FIGS. 4 and 7.

SECOND EMBODIMENT

Figure 8:
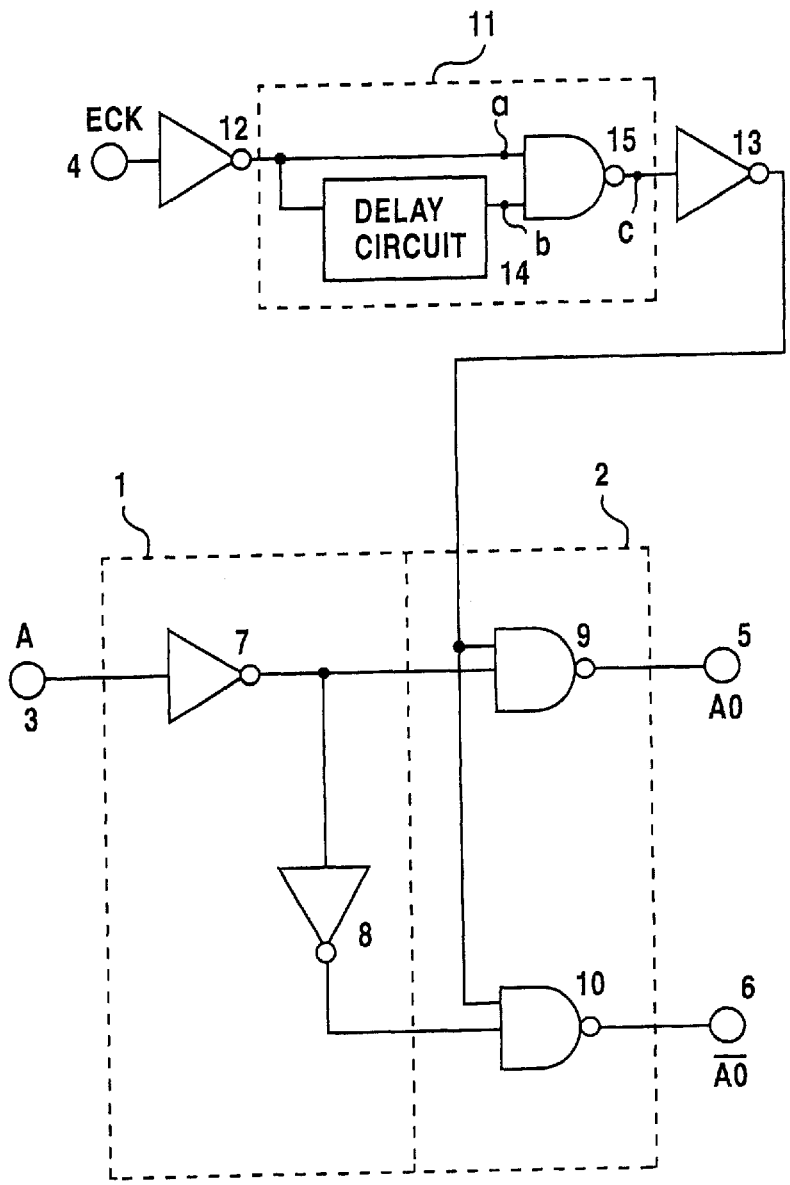
FIG. 8 (1) is a diagram illustrating the second embodiment of the present invention.
Figure 8:
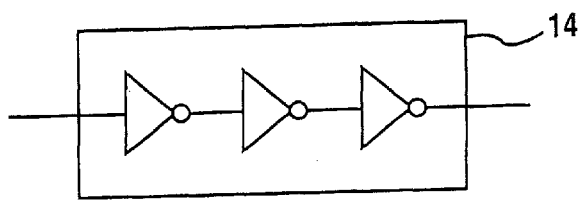

FIGS. 8(1) and 8(2) illustrate the second embodiment of the present invention.

The second embodiment of the present invention discloses generating the clock signal from an external circuit for the clock signal for an internal circuit.

The signal input circuit 1 and the pulse signal generating circuit 2 have the same structure as the signal input circuit and pulse signal generating circuit of FIG. 4. Therefore, like the first embodiment of the present invention of FIG. 4, only one setup time is required when generating the pulse signal supplied to an internal circuit from the input of the address signal. Thus, the time required for generating the pulse signal from the input of the address signal can be reduced.

However, when the clock pulse width of the clock signal from the external circuit is wide, and if the clock signal from the external circuit is used directly as the clock signal for the internal circuit, the internal circuit operates with the pulse signal having a wider pulse width and the hold time of the address signal becomes larger. In many cases, such a phenomenon is undesirable from the viewpoint of design. Therefore, the second embodiment of the present invention cuts off (chops) the clock signal from the external circuit to generate a clock signal for the internal circuit having a narrow pulse width. Accordingly, the pulse signal to be supplied to the internal circuit is generated using the clock signal from the internal circuit.

In FIG. 8(1), the clock signal ECK from an external circuit, supplied to the clock signal terminal 4 from an external circuit is supplied to the pulse signal generating circuit 2 as the clock signal for the internal circuit via a chopper circuit 11 formed of a delay circuit 14 and the NAND circuit 15. In more detail, the clock signal ECK from an external circuit is supplied to the chopper circuit 11 via the inverter 12. In the chopper circuit 11, the inverted clock signal from the external circuit/ECK is supplied directly to one of the input terminals of the NAND circuit 15 and is also supplied to the other input terminal of the NAND circuit 15 via the delay circuit 14. An output of the chopper circuit 11 is inverted with the inverter 13 and is then supplied to the pulse signal generating circuit 2 as the clock signal ICK for the internal circuit.

Figure 9:
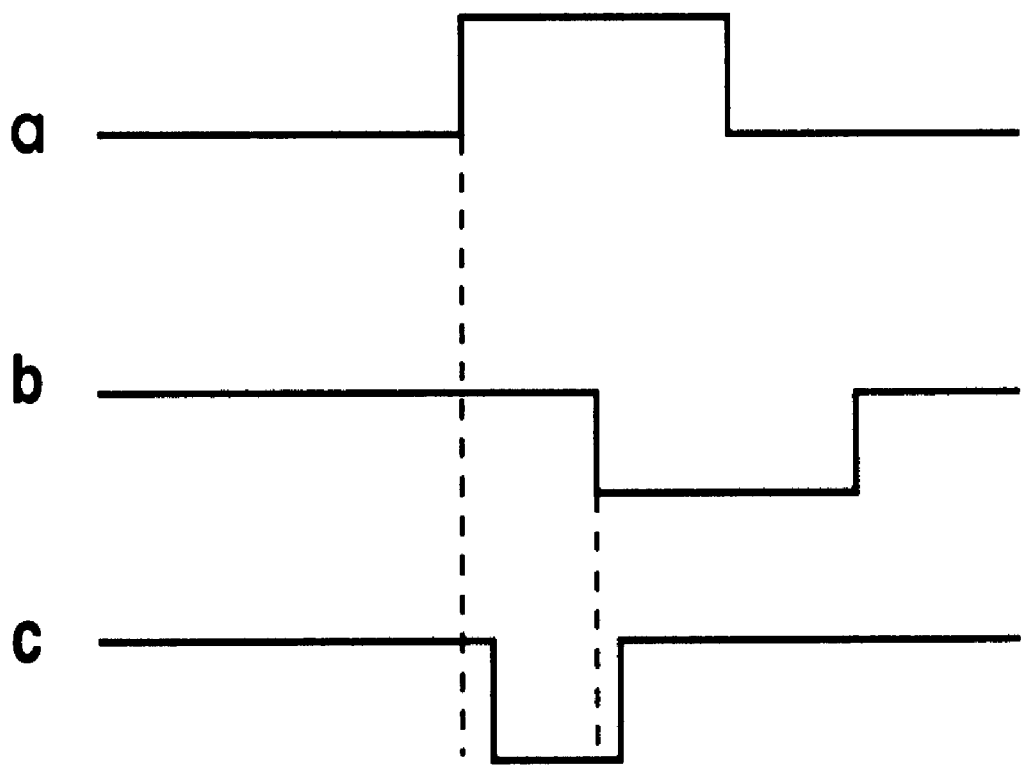
FIG. 9 is a diagram illustrating the second embodiment of the present invention.

FIG. 9 illustrates the principle of the chopper circuit 11.

In FIG. 8(1), a is one of the input nodes of the NAND circuit 15 in which the inverted clock signal/ECK from the external circuit is directly supplied; b is the other input node of the NAND circuit 15 in which the inverted clock signal/ECK from the external circuit is supplied with a delay; and c is an output node of the NAND circuit 15. When both nodes a and b are in the high level, node c becomes in the low level but may become in the high level in other cases. During the delay time, nodes a and b become in the high level and the pulse signal, having the pulse width identical to the delay time, is generated at node c. When the delay circuit 14 provides an output in which the logical state of the input signal is inverted, it is possible to generate the pulse signal having the pulse width identical to the delay time.

FIG. 8(2) illustrates an example of the delay circuit 14 having three cascade-connected inverters. However, in the delay circuit as explained above, it is sufficient that the input signal is inverted as an output. Therefore, the circuit is not limited to the circuit configuration of FIG. 8(2). For instance, it is also possible to cascade connect the inverters in odd numbers other than three.

When the chopper circuit 11 is used as explained above, the pulse signal having a pulse width identical to a delay time of the inverted clock for external circuit can be generated.

Figure 10:
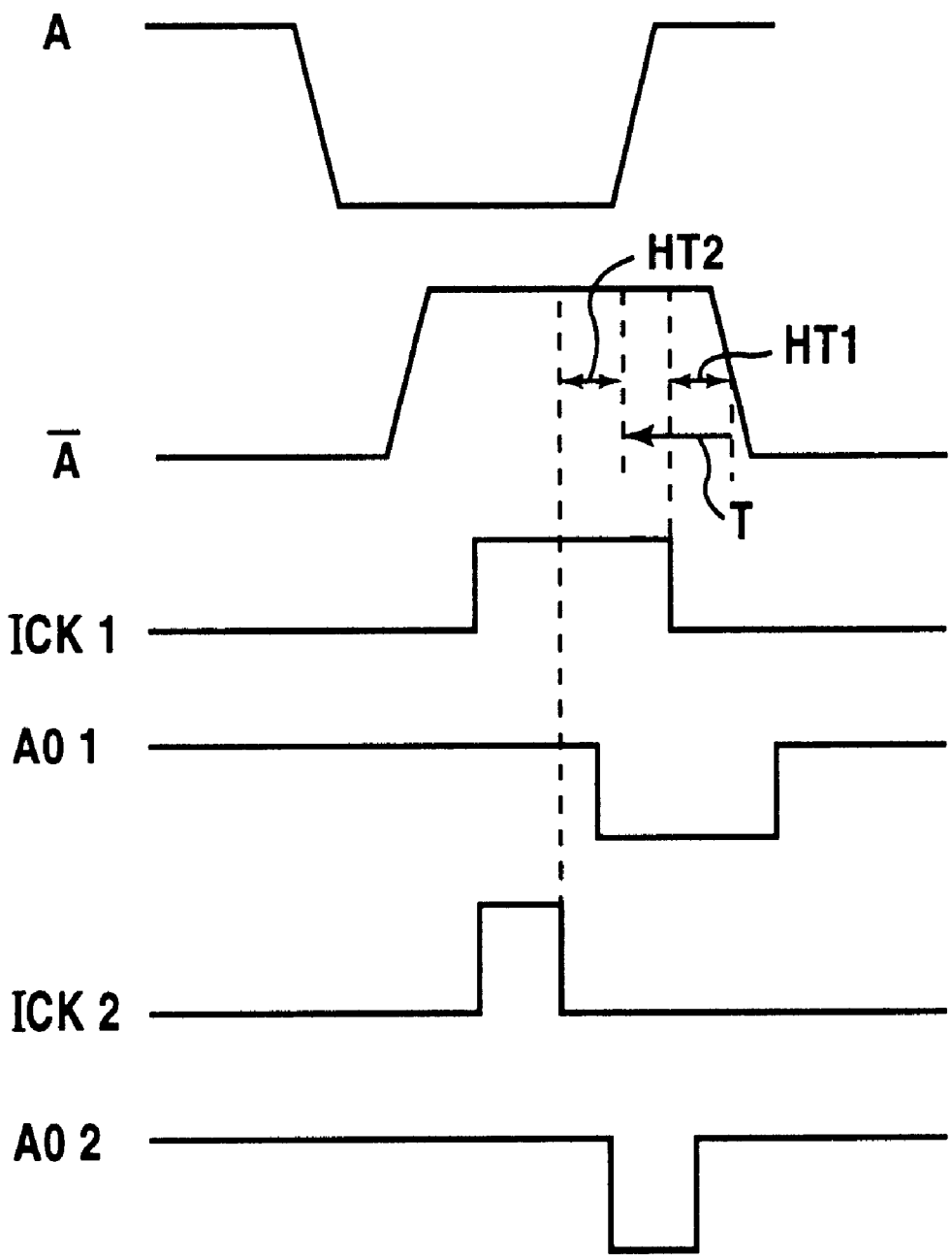
FIG. 10 is a diagram illustrating the second embodiment of the present invention.

FIG. 10 illustrates the example where the clock signal from the external circuit having a wide clock pulse width is used directly as the clock signal for the internal circuit and the clock signal from the external circuit is cut off (chopped) with the chopper circuit 11; and the clock obtained is used as the clock signal for the internal circuit.

ICK1 is the clock signal for the internal circuit directly using the clock signal from the external circuit. AO1 is the pulse signal generated with the clock signal ICK1 for the internal circuit. ICK2 is the clock signal for the internal circuit obtained by cutting off (chopping) the clock signal from the external circuit and AO2 is the pulse signal generated with the clock signal ICK2 for the internal circuit. Moreover, HT1 is the hold time for the clock signal ICK1 for the internal circuit and HT2 is the hold time for the clock signal ICK2 for the internal circuit.

As illustrated in FIG. 10, when the clock signal ICK2 for the internal circuit is used, the hold time is completed earlier, as much as T (indicated with thick arrow mark), in comparison to where the clock signal ICK1 for the internal circuit is used. Namely, in the clock signal ICK1 for the internal circuit, the hold time of the address signal A can be reduced as much as time T in comparison with the clock signal ICK2 for the internal circuit. Therefore, according to the second embodiment of the present invention, timing design of the address signal becomes easier because the hold time of the address signal can be reduced.

THIRD EMBODIMENT

Figure 11:
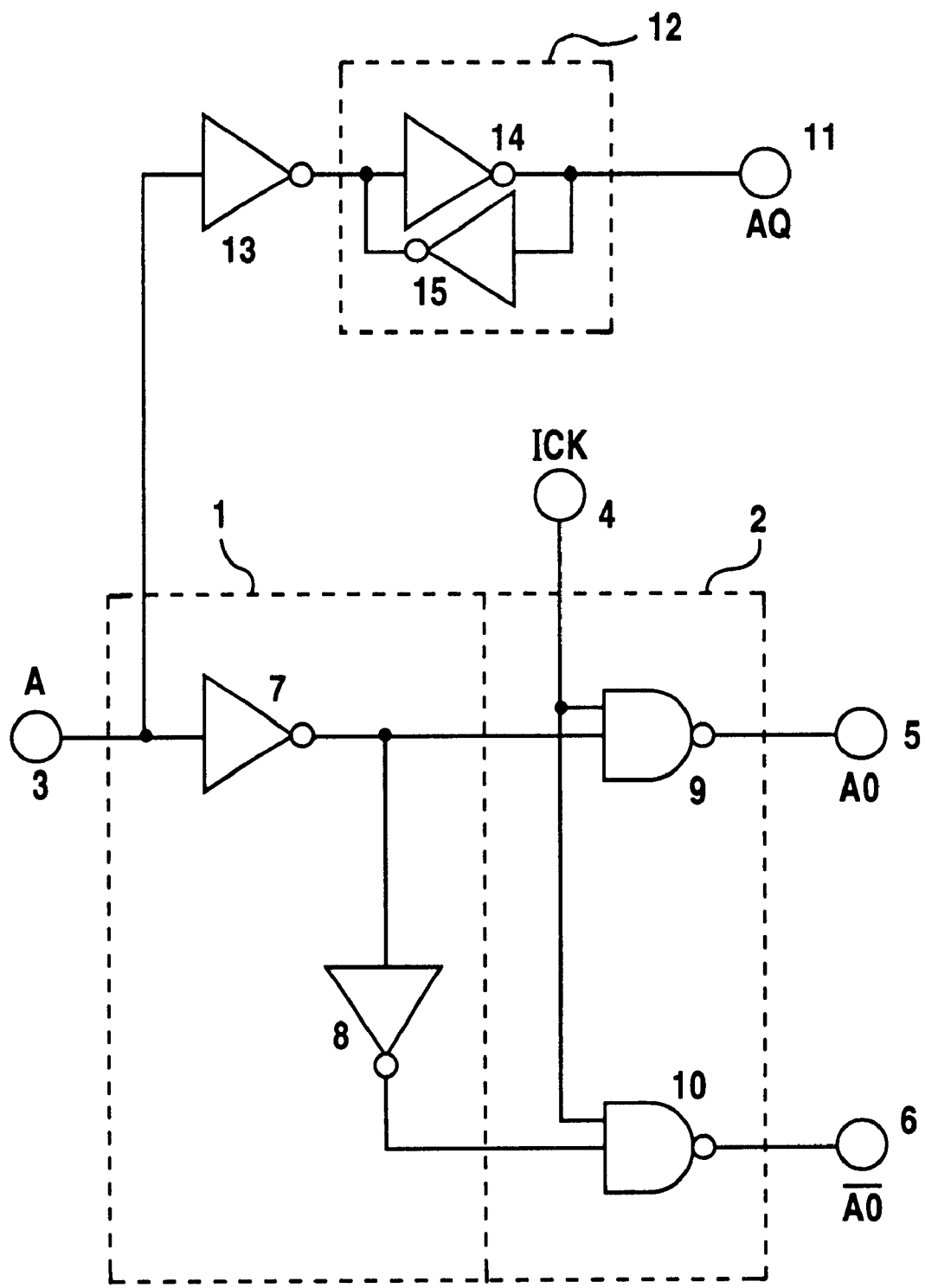
FIG. 11 is a diagram illustrating the third embodiment of the present invention.

FIG. 11 illustrates the third embodiment of the present invention.

The third embodiment of the present invention holds the address signal.

The signal input circuit 1 and the pulse signal generating circuit 2 are identical in structure to the signal input circuit and the pulse signal generating circuit as illustrated in FIG. 4. Therefore, like the first embodiment of the present invention, only one setup time is required for generating the pulse signal supplied to the internal circuit from the input of the address signal. Additionally, the time required for generating the pulse signal from the input of the address signal can be reduced.

However, the circuit illustrated in FIG. 4 cannot hold an address signal. From the point of view of circuit design, it is necessary, in certain cases, that the address signal be stored and held. Therefore, in the third embodiment of the present invention, a memory circuit for storing the address signal is provided in order to store and hold the address signal, in addition to the signal input circuit 1 and pulse signal generating circuit 2. Since the memory circuit is not provided on the main path with which the address signal is supplied to the internal circuit, high-speed operation of the main path can be realized.

In FIG. 11, a memory circuit 12 having inverters 14 and 15 is connected to the address signal input terminal 3 via the inverter 13. The inverter 13 is provided to prevent a load increase from the address signal input terminal 3. Namely, when the inverter using a small size transistor is connected to the address signal input terminal 3, the load from the address signal input terminal is smaller than that of the memory circuit formed of the inverter using a large size transistor connected directly thereto. The address signal stored and held in the memory circuit 12 is outputted from the address signal output terminal 11. The memory circuit 12 has the capability to store and hold the address signal, and the memory circuit 12 is not limited to the circuit configuration illustrated in FIG. 11.

FOURTH EMBODIMENT

Figure 12:
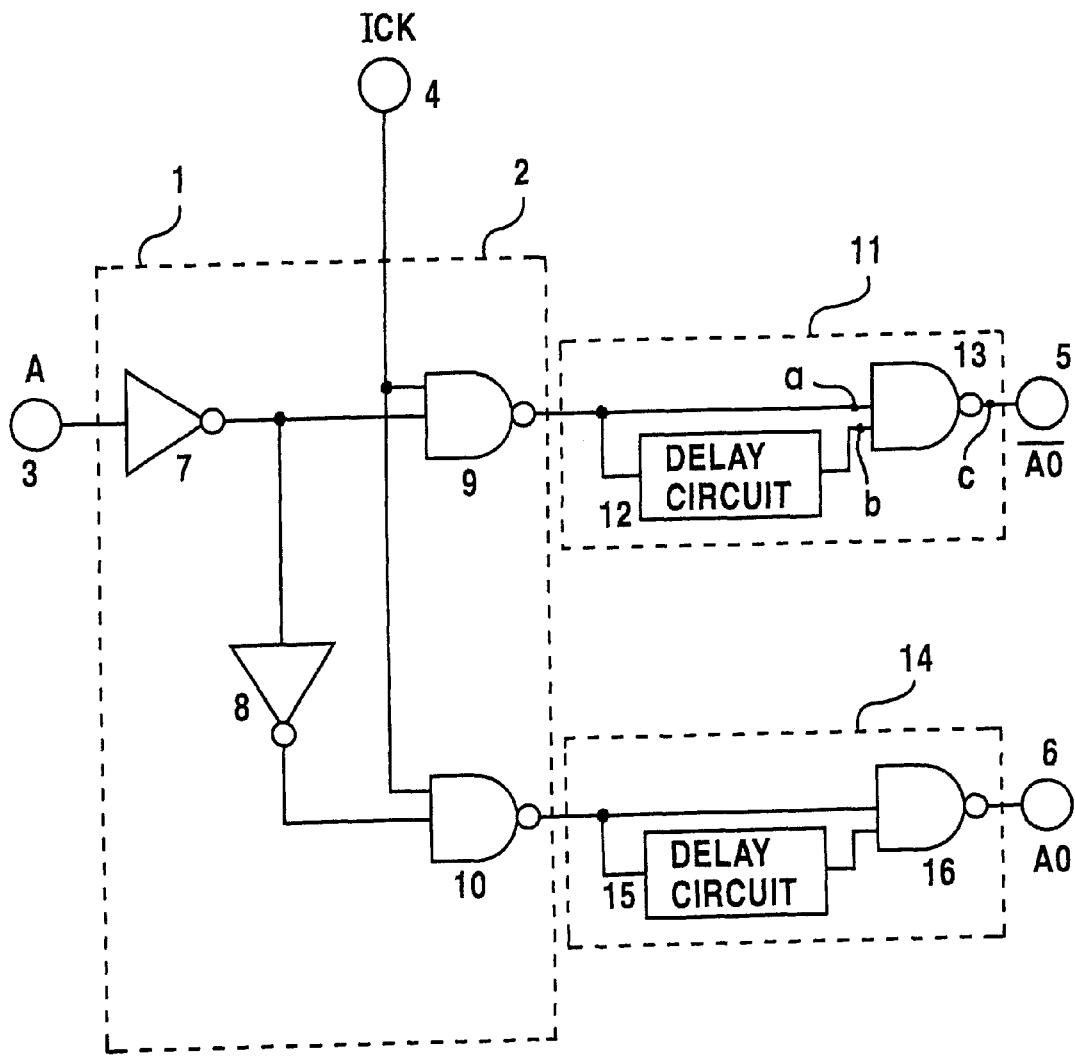
FIG. 12 (1) is a diagram illustrating the fourth embodiment of the present invention.
Figure 12:
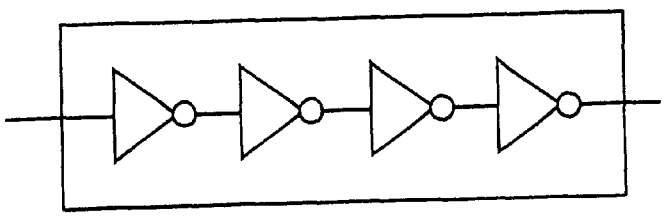

FIGS. 12(1) and 12(2) illustrate the fourth embodiment of the present invention.

The fourth embodiment of the present invention illustrates an example where the internal circuit requires a pulse signal having wider pulse width.

The signal input circuit 1 and pulse generating circuit 2 are identical in the structure to the signal input circuit and the pulse signal generating circuit of FIG. 4. Therefore, like the first embodiment of the present invention shown in FIG. 4, only one setup time is required for generating the pulse signal to be supplied to the internal circuit from the input of the address signal. Furthermore, the time required for generating the pulse signal from the input of the address signal can be reduced.

When the internal circuit requires a pulse signal having wide pulse width, it is sufficient to use the clock signal having wider pulse width in the first embodiment of the present invention. However, when the hold time of the address signal is short, it is impossible to use the clock signal for the internal circuit having the wider pulse width because the clock signal must be generated depending on the hold time of address signal. Therefore, in the fourth embodiment of the present invention, after the pulse signal is generated in the pulse signal generating circuit 2, the pulse width of the pulse signal is adjusted, generating a pulse signal with wider pulse width.

In FIG. 12(1), the pulse signal outputted from the pulse signal generating circuit 2, is supplied to the internal circuit via a stretch circuit 11 having a delay circuit 12 and NAND circuit 13, or via a stretch circuit 14, having a delay circuit 15 and NAND circuit 16. In the stretch circuit 11, the pulse signal is directly supplied to one of the input terminals of the NAND circuit 13 and is also supplied via the delay circuit 12 to the other input terminal of the NAND circuit 13. Similarly, in the stretch circuit 14, the pulse signal is also directly supplied to one of the input terminals of the NAND circuit 16 and is supplied, via the delay circuit 15, to the other input terminal of the NAND circuit 16. Outputs from the stretch circuits 11 and 14 are respectively outputted to the output terminals 5 and 6 and are then supplied to the internal circuit.

Figure 13:
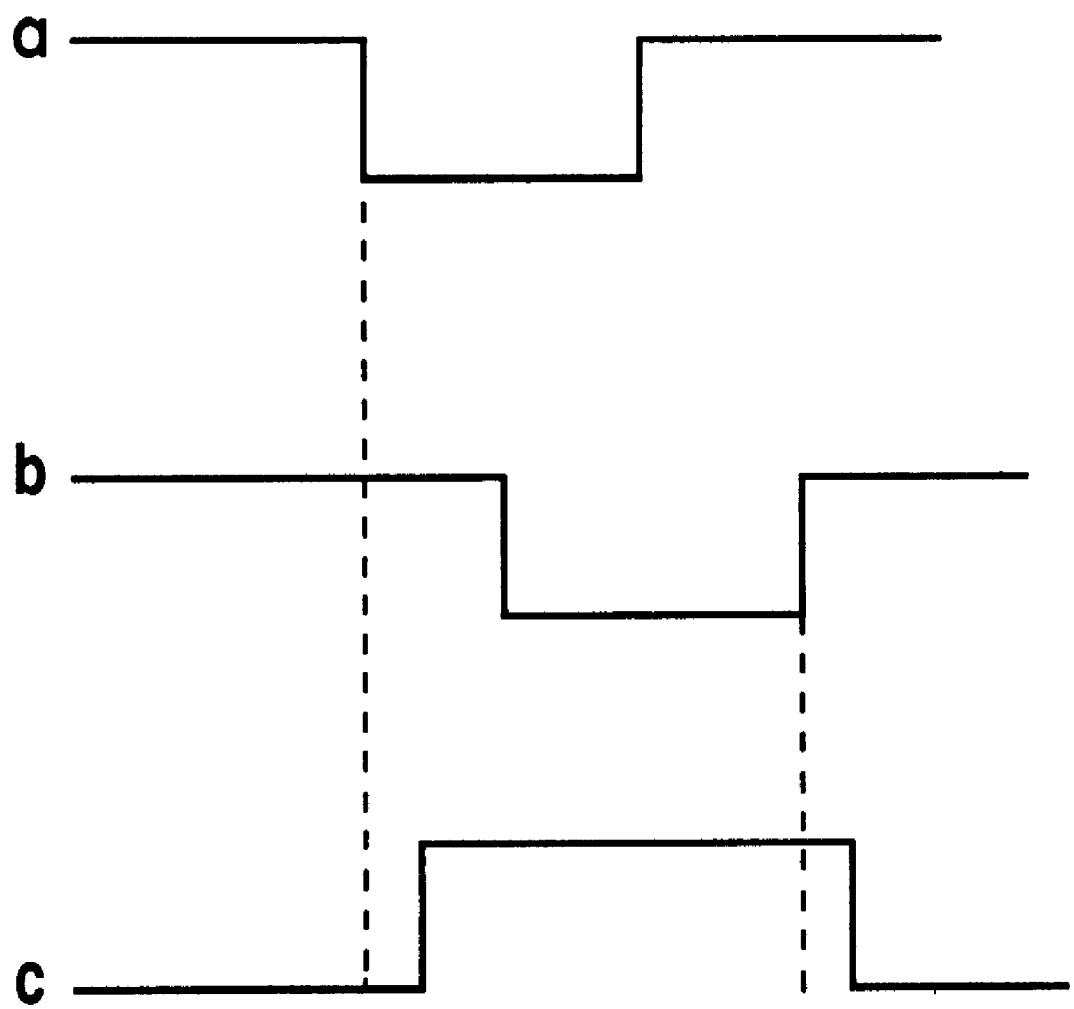
FIG. 13 is a diagram illustrating the fourth embodiment of the present invention.

FIG. 13 illustrates the principle of a stretch circuit.

In FIG. 12(1), a is one of the input nodes of the NAND circuit 13 in which the pulse signal is directly supplied thereto; b is the other input node of the NAND circuit 13 in which the delayed pulse signal is supplied; and c is the output node of the NAND circuit 13. When any one of the nodes a and b is in the low level, node c becomes in the high level, but in other cases, node c becomes in the low level. When any one of the node a and node b becomes in the low level during the period identical to the addition of the pulse width of the pulse signal and delay time, and the pulse signal having the pulse duration identical to the addition of pulse width of pulse signal, delay time is generated in the node c. Furthermore, when the delay circuit is formed wherein the logic of the input signal is directly outputted, the pulse signal having the pulse width identical to the addition of the pulse width of the pulse signal, delay time can be generated.

FIG. 12(2) illustrates an example of the delay circuit 12 and delay circuit 15. In FIG. 12(2), four inverters are cascade-connected but it is enough in the delay circuit that the logic of input signal is directly outputted without inversion. Therefore, the circuit configuration is not limited to that of FIG. 12(2). It is also possible that the inverters are cascade-connected in an even number other than four. As explained above, when the stretch circuit is used, the pulse signal with pulse width identical to the addition of pulse width of the pulse signal, delay time of the pulse signal can be generated.

In order to enhance the driving capability, buffering of the pulse signal is conducted after generation thereof. For example, the pulse signal is supplied to the internal circuit via the serially connected circuit such as an inverter using a large size transistor. The delay circuit and NAND circuit forming the stretching circuit 11 are considered to be part of the serially connected circuit elements or are inserted between the serially connected circuit elements. The stretch circuit 11 for expanding the pulse width does not increase delay time in the signal propagation.

FIFTH EMBODIMENT

Figure 14:
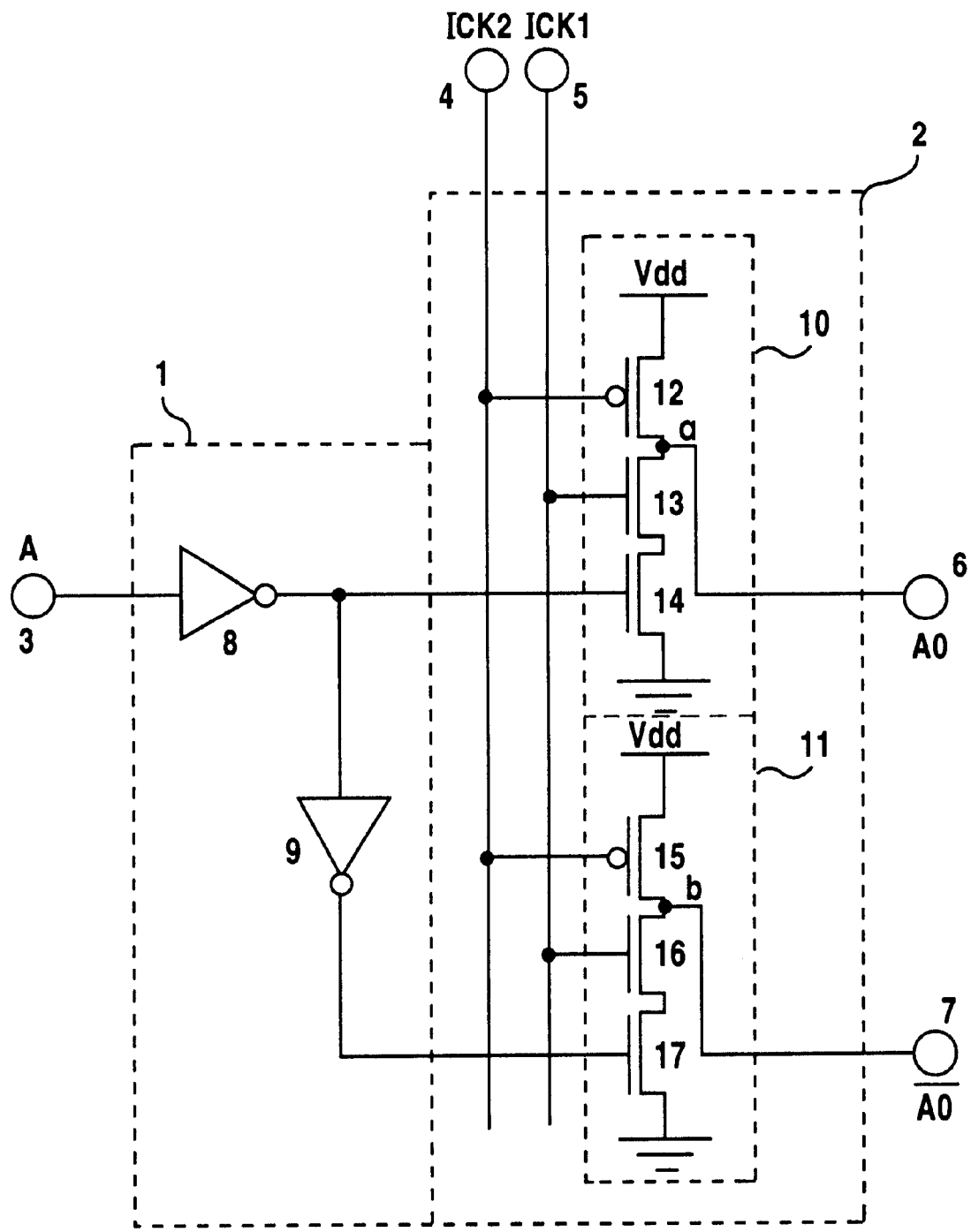
FIG. 14 is a diagram illustrating the fifth embodiment of the present invention.

FIG. 14 illustrates the fifth embodiment of the present invention.

Like the fourth embodiment of the present invention, a pulse signal of wider pulse width is required in the internal circuit of the fifth embodiment.

Similar to the first embodiment of the present invention of FIG. 4, the fifth embodiment of the present invention does not include a memory circuit for holding the address signal on the main path for generating the pulse signal by inputting the address signal and then supplying the pulse signal to the internal circuit. Therefore, only one setup time is required during the period for generating the pulse signal to be supplied to the internal circuit from the input of the address signal. Therefore, the time required for generating the pulse signal from the input of the address signal can be reduced.

In the fourth embodiment of the present invention, the pulse width of the pulse signal is expanded using a stretch circuit 11 after generating the pulse signal. On the other hand, in the fifth embodiment, the structure of the pulse signal generating circuit is formed differently from the pulse signal generating circuit of the fourth embodiment since the pulse signal of wide pulse width can be generated in the pulse signal generating circuit.

In FIG. 14, the signal input circuit 1 is identical in structure to the signal input circuit of FIG. 4. The address signal A and inverted address signal/A outputted from the signal input circuit 1 are supplied to the pulse signal generating circuit 2.

The pulse signal generating circuit 2 is formed of two circuits. In the first circuit 10, the first P-channel transistor 12, the first N-channel transistor 13 and the second N-channel transistor 14 are connected in series. The source of first P-channel transistor 12 is connected to the high voltage power supply (Vdd), and the source of second N-channel transistor 14 is connected to the low voltage power supply (Vss). In the second circuit 11, the second P-channel transistor 15, third N-channel transistor 16 and fourth N-channel transistor 17 are connected in series. The source of the second P-channel transistor 15 is connected to the high voltage power supply (Vdd), and the source of the fourth N-channel transistor 17 is connected to the low voltage power supply (Vss).

The inverted address signal/A is supplied from the signal input circuit 1 to the gate of the second N-channel transistor 14 of the first circuit 10, while the address signal A is supplied from the signal input circuit to the gate of the fourth N-channel transistor 17 of the second circuit 11. Additionally, the first clock signal ICK1 for the internal circuit is supplied from the first clock signal terminal 5 for the internal circuit to the gate of the first N-channel transistor 13 of the first circuit 10 and the gate of the third N-channel transistor 16 of the second circuit 11. The second clock signal ICK2 for the internal circuit is supplied from the second clock signal input terminal 4 for the internal circuit to the gate of the first P-channel transistor 12 of the first circuit 10 and the gate of the second P-channel transistor 15 of the second circuit 11. The output terminal 6 of the first circuit 10 is connected to node a, which is the connecting point of the first P-channel transistor 12. The first N-channel transistor 13 of the first circuit 10 and the output terminal 7 of the second circuit 11 are connected to node b, which is the connecting point of the second P-channel transistor 15 and the third N-channel transistor 16 of the second circuit 11.

The pulse signal generated in the pulse signal generating circuit 2 is outputted to the output terminal 6 of the first circuit 10, and to the output terminal 7 of the second circuit 11, and are subsequently supplied to the internal circuit.

Figure 15:
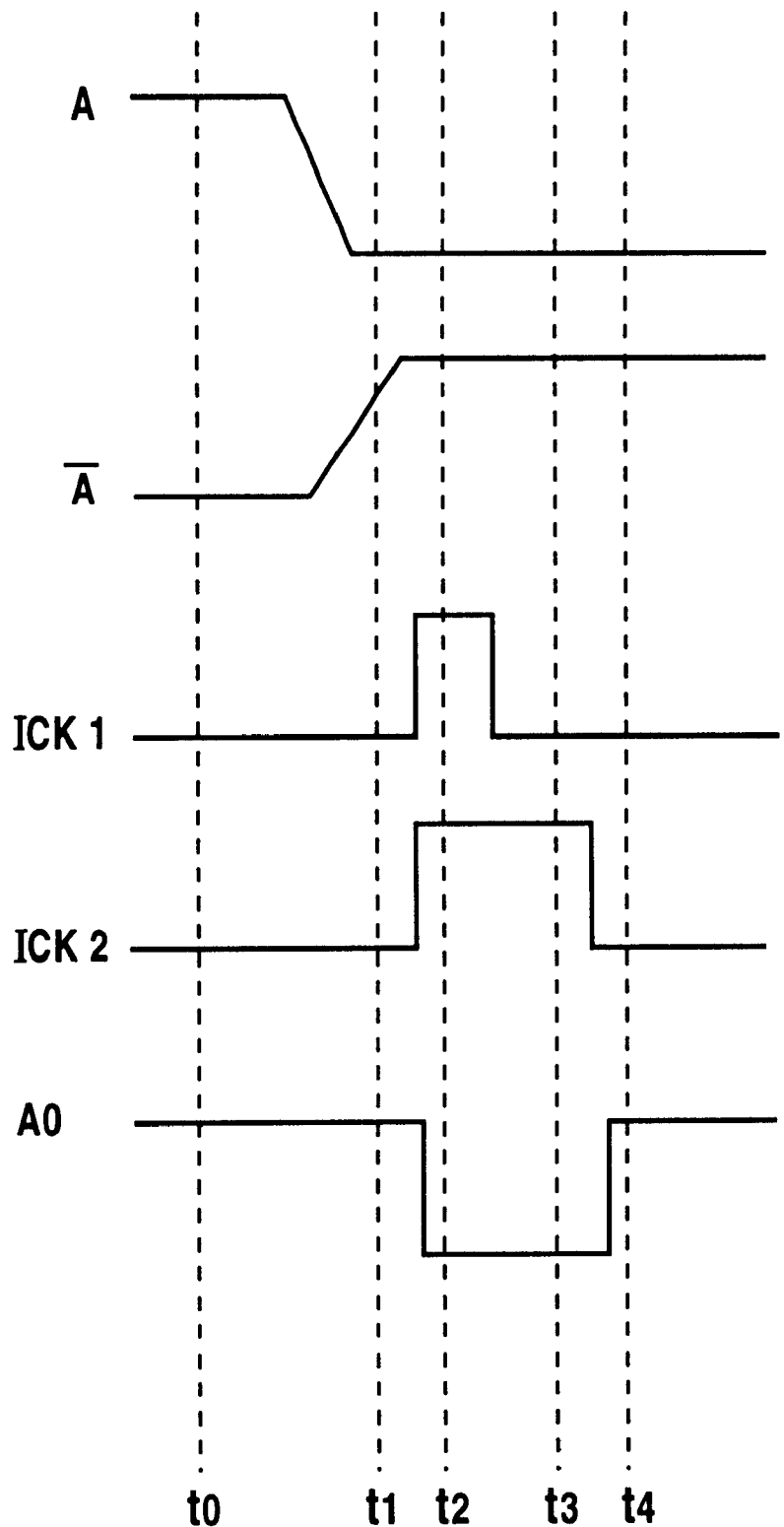
FIG. 15 is a diagram illustrating the fifth embodiment of the present invention.

FIG. 15 illustrates the timing chart of the circuit of FIG. 14, where the address signal A supplied to the address signal input terminal 3 changes to the low level.

Operations of FIG. 14 will be explained on the basis of the timing chart of FIG. 15.

(1) Time t0 (Before the Address Signal A Changes)

The first clock signal ICK1 for the internal circuit and the second clock signal ICK2 for the internal circuit are set to the low level. Therefore, the first P-channel transistor 12 of the first circuit 10, and the second P-channel transistor 15 of the second circuit 11 are ON (conductive); and whereas the first N-channel transistor 13 of the first circuit 10 and the third N-channel transistor 16 of the second circuit 11 are OFF (not conductive). Therefore, the output signal AO from the output terminal 6 of the first circuit 10, and the output signal /AO from the output terminal 7 of the second circuit 11 are set to the high level.

(2) Time t1 (Address Signal A Changes to the Low Level)

The address signal A changes from the high level to the low level. The high-level inverted address signal/A is supplied to the gate of the second N-channel transistor 14 of the first circuit 10, and the second N-channel transistor 14 of the first circuit 10 turns ON. The address signal A of the low level is supplied to the gate of the fourth N-channel transistor 17 of the second circuit 11, and the fourth N-channel transistor 17 of the second circuit 11 turns OFF. However, since the clock ICK1 for the internal circuit and the second clock signal ICK2 for the internal circuit do not change, both the output signal AO from the output terminal 6 of the first circuit 10 and the output signal/AO from the output terminal 7 of the second circuit 11 maintains the high level.

(3) Time t2 (Both First Clock ICK1 For the Internal Circuit and Second Clock ICK2 For the Internal Circuit Change to the High Level)

Both the first clock signal ICK1 for the internal circuit and the second clock signal ICK2 for the internal circuit are set to the high level. Therefore, the first P-channel transistor 12 of the first circuit 10 and the second P-channel transistor 15 of the second circuit 2 turn OFF, and the first N-channel transistor 13 of the first circuit 10 and the third N-channel transistor 16 of the second circuit 11 turn ON. In this timing, the second N-channel transistor 14 of the first circuit 10 turns ON, and the fourth N-channel transistor 17 of the second circuit 11 turns OFF. Therefore, the output signal AO from the output terminal 6 of the first circuit 10 is lowered to the low level, but the output signal/AO from the output terminal 7 of the second circuit 11 maintains the high level.

(4) Time t3(Only the First Clock Signal ICK1 For Internal Circuit Changes to the Low Level)

Figure 16:
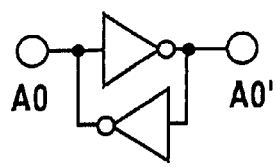
FIG. 16 (1) is a diagram illustrating the fifth embodiment of the present invention.
Figure 16:
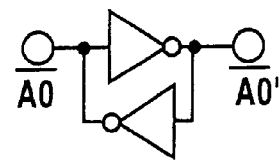
Figure 16:
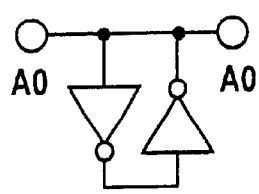
Figure 16:
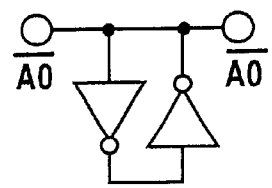
Figure 16:
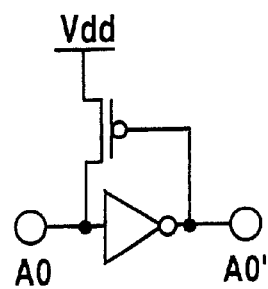
Figure 16:
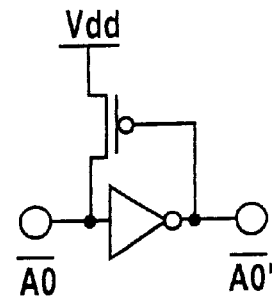
Figure 16:
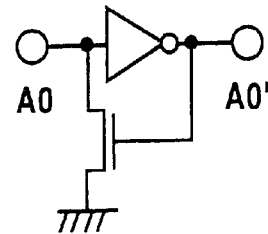
Figure 16:
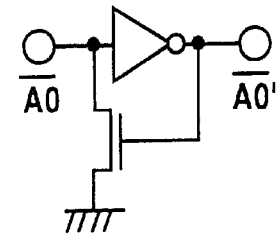

The first clock signal ICK1 for the internal circuit is set to the low level and the second clock signal ICK2 for the internal circuit is set to the high level. Both the first N-channel transistor 13 of the first circuit 10 and the third N-channel transistor 16 of the second circuit 11 turn OFF. Therefore, the output signal AO from the output terminal 6 of the first circuit 10 and the output signal/AO from the output terminal 7 of the second circuit 11 maintain the signal level at time t2. Namely, the output signal AO maintains the low level, while the output signal/AO maintains the high level, respectively. In this case, node a of the first circuit 10 and node b of the second circuit 11 are separated (floated) from the high voltage power supply (Vdd) and the low voltage power supply (Vss). This does not result in any problem because the time of the floating condition is rather short (for example, no problems are generated when the internal pulse width is about 1 ns). However, when a wider pulse width is required, it is necessary to avoid the floating condition by connecting the circuits of FIG. 16, respectively, to the output terminal 6 of the first circuit 10 and the output terminal 7 of the second circuit 11. The circuits illustrated in FIG. 16(1) to FIG. 16(8) are latch circuits (memory circuits). These circuits change signals from the floating condition outputted from the pulse signal generating circuit to signals not in the floating condition. As explained with reference to the fourth embodiment of the present invention, the pulse signal is buffered (for example, the pulse signal is supplied to the internal circuit via a serially connected circuit, such as an inverter using a large size transistor). When the circuit to be inserted is provided within the buffer (for example, inserted between the circuit elements connected in serial), the circuit to be inserted does not increase delay of the signal propagation. Even if the circuit of FIG. 16 is not inserted, the floating condition may be avoided by adding a transistor and a capacitor which have a lower driving capability and are always in the ON state to the output terminal 6 of the first circuit 10 and the output terminal 7 of the second circuit 11.

(5) Time t4(Second Clock ICK2 for the Internal Circuit Changes to the Low Level)

The second clock signal ICK2 for the internal circuit is set to the low level. Therefore, the first P-channel transistor 12 of the first circuit 10 and the second P-channel transistor 15 of the second circuit 11 turn ON. Therefore, both the output signal AO from the output terminal 5 of the first circuit 10 and the output signal /AO from the output terminal 7 of the second circuit 11 become high level. Namely, the condition same as that of to may be attained.

The circuit operations explained above may be summarized as follows.

(1) pulse signal generating circuit is in the reset condition (time t0).

(2) Change of address signal is input to the pulse signal generating circuit (time t1).

(3) Generation of pulse signal based on change of address signal starts by setting the first clock signal ICK1 for the internal circuit and the second clock signal ICK2 for the internal circuit to the high level (time t2).

(4) Change of address signal is held in the pulse signal generating means when using the floating condition by setting the first clock signal ICK1 for the internal circuit to the low level (time t3).

(5) Generating the pulse signal in the pulse signal generating circuit is completed in order to return to the reset condition by setting the second clock signal ICK2 for the internal circuit to the low level (time t4).

The first clock signal ICK1 for the internal circuit starts generating the pulse signal on the basis of change of address signal. The second clock signal ICK2 for the internal circuit adjusts the output period of the pulse signal (pulse width of pulse signal). Therefore, in the first clock signal ICK1 for the internal circuit, the pulse width is set in accordance with the period of the address signal, while in the second clock signal ICK2 for the internal circuit, the pulse width is set in accordance with the pulse width of pulse signal supplied to the internal circuit.

As explained above, the fifth embodiment of the present invention generates the pulse signal having wider pulse width to be supplied to the internal circuit using a couple of clock signals for the internal circuit.

What is claimed is:

1. A semiconductor integrated circuit comprising:
    a signal input circuit for receiving an input signal and for outputting an address signal as a function of the input signal without holding the functional signal thereof;
    a pulse signal generating circuit coupled to the signal input circuit, for generating a pulse signal based on the functional signal and a first clock signal; and
    a chopper circuit for generating a first signal by narrowing the pulse width of a second clock signal and supplying the first signal to the pulse signal generating circuit as the first clock signal.

2. The semiconductor integrated circuit according to claim 1, wherein the chopper circuit includes a gate circuit for supplying the second clock signal and a delayed second clock signal.

3. The semiconductor integrated circuit according to claim 2, wherein the chopper circuit includes a delay circuit for delaying the second clock signal and for outputting an inverted second clock signal.

4. A semiconductor integrated circuit comprising:
    a signal input circuit for receiving an input signal and for outputting an address signal as a function of the input signal without holding the functional signal thereof;
    a pulse signal generating circuit coupled to the signal input circuit, for generating a pulse signal based on the functional signal and a first clock signal; and
    a stretch circuit for generating a delayed pulse signal by widening pulse width of the pulse signal outputted from the pulse signal generating circuit.

5. The semiconductor integrated circuit according to claim 4, wherein the stretch circuit includes a gate circuit for supplying the pulse signal and the delayed pulse signal.

6. The semiconductor integrated circuit according to claim 4, wherein the stretch circuit includes a delay circuit for delaying the pulse signal and for outputting the pulse signal without inverting it.

7. A semiconductor integrated circuit comprising:
    a signal input circuit for receiving an input signal and for outputting an address signal as a function of the input signal without holding the functional signal thereof; and
    a pulse signal generating circuit coupled to the signal input circuit, for generating a pulse signal based on the functional signal, a first clock signal, and a second clock signal.

8. The semiconductor integrated circuit according to claim 7, wherein the pulse signal generating circuit starts the generation of the pulse signal based on the first clock signal and adjusts the pulse width of the pulse signal with the second clock signal.

9. The semiconductor integrated circuit according to claim 7, wherein the pulse signal generating circuit includes a gate circuit supplying at least one of the input signal, the first clock signal or the second clock signal.

10. The semiconductor integrated circuit according to claim 9, wherein the gate circuit includes a first transistor, a second transistor and a third transistor, the first transistor, the second transistor and the third transistor being coupled in series, and wherein a first gate of the first transistor has the input signal supplied thereto; a second gate of the second transistor has the first clock signal supplied thereto; and a third gate of the third transistor has the second clock signal supplied thereto.

11. The semiconductor integrated circuit according to claim 9, wherein the pulse width of the pulse signal is adjusted utilizing a floating condition of the gate circuit.

12. The semiconductor integrated circuit according to claim 7, wherein the pulse generating circuit includes a circuit at the output thereof for preventing signal propagation in a floating condition.

13. The semiconductor integrated circuit according to claim 7, wherein the pulse generating circuit includes a capacitor at the output thereof for preventing signal propagation in a floating condition.

14. A semiconductor integrated circuit comprising:
    a signal input circuit for receiving an input signal and for outputting an address signal as a function of the input signal without holding the functional signal thereof;
    a pulse signal generating circuit coupled to the signal input circuit, for generating a pulse signal based on the functional signal and a first clock signal; and
    a memory circuit for holding the input signal;
    wherein the memory circuit is located at a position outside a signal path in which the input signal is inputted and the pulse signal is generated.

15. A pulse signal generating method comprising:
    receiving an input signal and outputting an address signal as a function of the input signal without holding the functional signal thereof;
    receiving a first clock signal;
    receiving a second clock signal;
    generating a pulse signal based on the functional signal, the first clock signal and the second clock signal.

* * * * *